United States Patent [19]

Puisto

[11] Patent Number: 5,424,548
[45] Date of Patent: Jun. 13, 1995

[54] PATTERN SPECIFIC CALIBRATION FOR E-BEAM LITHOGRAPHY

[75] Inventor: Denise M. Puisto, Milton, Vt.

[73] Assignee: International Business Machines Corp., Armonk, N.Y.

[21] Appl. No.: 124,733

[22] Filed: Sep. 21, 1993

[51] Int. Cl.$^6$ ............................................. H01J 37/30
[52] U.S. Cl. .................................. 250/491.1; 250/492.2
[58] Field of Search ..................... 250/491.1, 397, 492.2

[56] References Cited

U.S. PATENT DOCUMENTS

| 4,442,361 | 4/1984 | Zasio et al. | 250/491.1 |
| 4,467,211 | 8/1984 | Smith et al. | 250/492.2 |
| 4,583,298 | 4/1986 | Raugh | 33/502 |
| 4,621,371 | 11/1986 | Gotou et al. | 378/34 |
| 4,843,563 | 6/1989 | Takahashi et al. | 250/492.2 |
| 4,910,679 | 3/1990 | Takahashi et al. | 250/491.1 |
| 5,047,647 | 9/1991 | Itoh et al. | 250/491.1 |
| 5,048,103 | 9/1991 | Leclerc et al. | 382/44 |
| 5,124,927 | 6/1992 | Hopwell et al. | 250/491.1 |

Primary Examiner—Bruce C. Anderson
Attorney, Agent, or Firm—Thornton & Thornton

[57] ABSTRACT

A technique for creating an improved mask used in the semiconductor industry for replicating desired images in semiconductor bodies. The invention has application in both direct writing and blind writing processes and employs the steps of writing, in a sacrificial photoresist, a selected pattern of marks with an E-beam lithography system, measuring the actual pattern created and modifying the magnetic and electrostatic force used to control the beam to correct for stage translational errors, magnification, drift, mirror distortion, and column charging, caused by either mechanical aspects or by electrical problems in the system. A prototype mask is then created containing the actual image to be replicated, the image being provided with a plurality of alignment marks, and the actual positions of the marks in the prototype mask are measured. The magnetic and electrostatic forces used to create the prototype mask are modified to correct for process stress induced errors, localized heating and charging distortions, and effects due to the shape and layout of the pattern being created. As the last step, a final mask, suitable for use on the production line, is produced with the modified information.

10 Claims, 6 Drawing Sheets

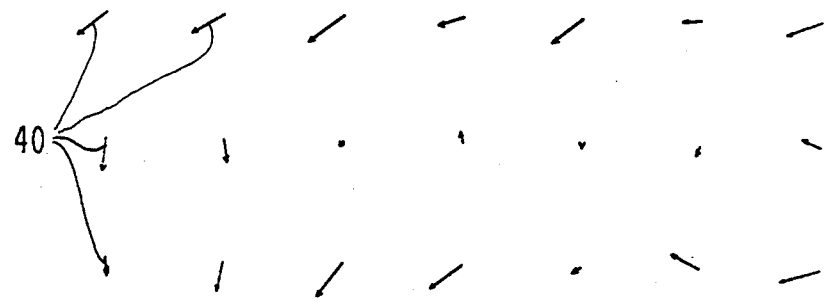
FIG. 7
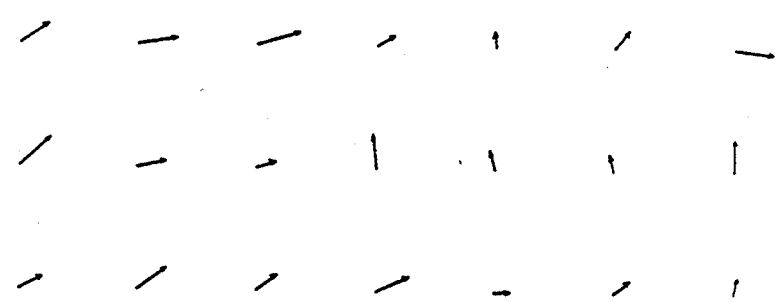
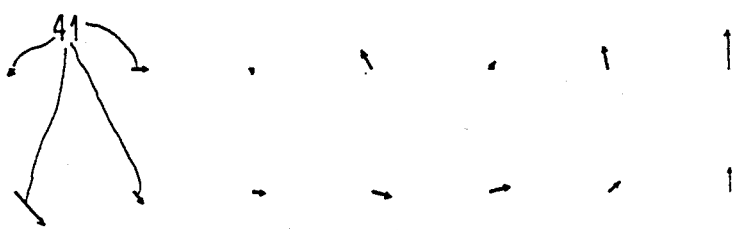
FIG. 8
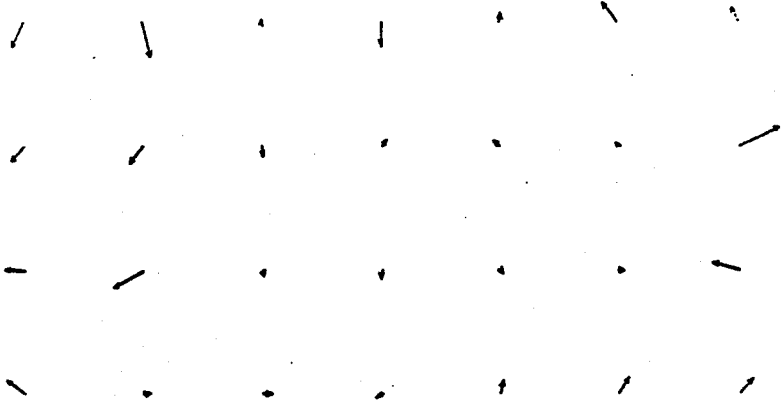

PATTERN SPECIFIC CALIBRATION FOR E-BEAM LITHOGRAPHY

FIELD OF THE INVENTION

This invention relates to electron beam (E-beam) lithography used in semiconductor manufacturing. More particularly it relates to a technique for controlling the magnetic and electrostatic forces used in controlling an E-beam so as to correct especially for distortion effects created during the E-beam writing process or mask fabrication process.

BACKGROUND OF THE INVENTION

Polymeric materials, such as photoresist, are widely used in the semiconductor industry to produce masks of all types. In mask making the photoresist is overlaid on a surface in which the desired image is to be formed, exposed to the desired image and developed so that the image formed in the photoresist can be replicated in the underlying surface.

Presently available X-ray lithography apparatus does not have an ability to manipulate the X-rays used. Therefore, reduced mask images, as used in present day optical steppers, cannot be used. Instead each X-ray mask must be fabricated full size which, accordingly, requires particularly tight specifications for image placement, image size, and defect control. Such tight specifications cannot be obtained by optical exposure of the photoresist. To achieve the extremely fine details in the resulting replicated image on the underlying surface, necessary to X-ray masks, the photoresist is exposed by electron beams (E-beams).

When using an E-beam apparatus to fabricate masks many things can cause distortions in the images produced. Correction of such distortions is especially necessary when X-ray masks are to be produced. For example, mechanical and electrical considerations of the E-beam apparatus used can cause distortions due to effects such as stage translational errors, magnification, drift, mirror distortion, and column charging. In X-ray masks other distortions, such as stress induced errors, often occur due to the process used to deposit the gold absorber material or to remove the photoresist. Still other distortions, such as localized heating during exposure and charging of the resist itself can occur due to interaction characteristics of the electrons in the beam and the photoresist. These distortions can be pattern dependent due to the shape and layout of the pattern being created in the photoresist. Since any of these distortions appearing in the mask used to produce the final product will be replicated in the final product it is desirable that the mask be created with as few distortions as possible. It is therefore important that correction or compensation be provided for as many of the above described distortions as is possible.

Attempts to correct for some distortions in E-beam mask making have been made in the past. For example, distortions due to mechanical stage translations have been corrected on a pixel by pixel basis by first printing registration marks on each pixel of a semiconductor wafer, in which the image is to be replicated, and then comparing the actual position of such marks on the wafer with the desired position of the marks on the wafer. Such a technique is not applicable to the E-beam lithographic processed in X-ray mask making known as blind writing, where sites for such registration marks are not available on the mask. Nor does such known technique correct for process induced distortions.

Another attempt at distortion correction in E-beam tools required the incorporation of a fly-eye lens in the E-beam apparatus. However, this fly-eye lens arrangement failed to correct process induced distortions and is also not useful with blind writing.

The solutions discussed above did result in some macroscopic improvements to the quality and uniformity of images replicated in the wafer, but they corrected only the grossest errors and did not correct the remainder of the above listed distortions. Until the present invention, extremely fine replication of the image over the entire surface of a mask was not realized.

As the demand for increasingly dense semiconductor devices has increased, even the slightest variation in an image formed over the entire wafer surface creates great difficulty in meeting the demand or results in defective devices.

SUMMARY OF THE INVENTION

The present invention is a method that will especially correct for process induced and pattern dependent distortions in E-beam formed images. The present invention thus particularly corrects for distortions created by or during the writing process such as distortion caused by column charging, localized heating during exposure, stress induced errors of deposited materials, resist charging and the like.

This significant improvement results from writing, with an E-beam, selected patterns of alignment marks onto the surface of a photoresist-coated sacrificial substrate, which is then developed. Next, the position of the marks formed therein is measured to determine the actual position of the formed marks, and compared to the position of where the marks should be if perfectly placed and no errors or distortions were present. The E-beam apparatus is then selectively modified to alter its magnetic and electrostatic forces used to control the beam so as to adjust the position of the marks such that the actual position of the marks matches the ideal as closely as possible. Once this information is provided to the E-beam apparatus, a prototype of the actual X-ray mask to be replicated is formed, the E-beam apparatus being controlled to compensate for all the previously detected errors and distortions. This prototype is provided with a series of alignment marks by creating the marks in the mask simultaneously with the image. These marks are placed in the design in any convenient position or area where they will not interfere with the pattern and configuration of the desired image. The prototype is now developed and because the pattern-induced distortions can alter both the configuration and the position of the marks, both the configuration and position of the formed images are compensated for by measuring the position of the marks and comparing their actual position with their ideal position. This information is then provided to the computer controlling the E-beam apparatus and a final mask is made in which all of the above-described errors and distortions have been corrected or compensated.

Accordingly it is an object of the invention to provide a unique method of correcting for hitherto uncorrectable position and configuration distortions in images formed by E-beam processing.

It is another object of the invention to provide an arrangement that assures that X-ray masks formed full size have a minimum number of distortions therein.

These and other objects and features of the present invention will become further apparent from the following description taken in conjunction with the drawings.

BRIEF DESCRIPTION OF THE DRAWINGS

FIG. 7 is a top view of a substrate similar to the substrate of FIG. 3 in which the un-compensated rotation, magnetic deflection, and skew distortions within a field is illustrated by a respective vector.

FIG. 8 is a top view of a substrate similar to that of FIG. 7 in which the compensated magnetic deflection effects within a field is illustrated by a respective vector.

DESCRIPTION OF THE PREFERRED EMBODIMENT

Figure 1:
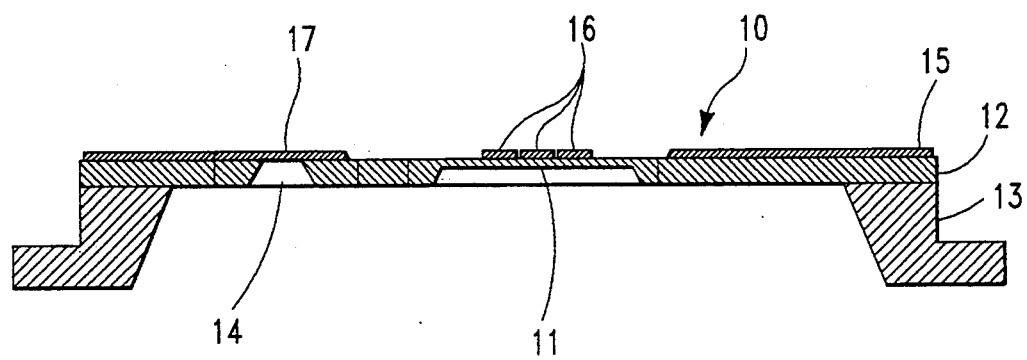
FIG. 1 is a cross-sectional schematic view of an X-ray mask of the type which the present invention can greatly benefit.

FIG. 1 illustrates an X-ray mask which can be improved by the present invention. The general process used to fabricate such X-ray masks is generally known.

In summary, the process requires a substrate 10 consisting of a typically 2.5 micron thick membrane region 11, etched into a boron doped silicon wafer 12, 100 mm in diameter, bonded to a dielectric support ring 13. This assembly forms a mask blank. Alignment windows can be created, in the blank, by coating the entire surface of the blank with polyimide 15 and etching the silicon away from the areas where the alignment windows are to be created. Although only a single alignment window 14 is shown, as many as is desirable can be made in the mask. Once the alignment windows are formed, the polyimide is removed from the central membrane area but left in the area over the alignment windows. The entire blank surface, including the polyimide layer, is then coated with thin layers of chrome and gold (not shown) as a plating base for later processing and overcoated with approximately 8000 Angstroms of an E-beam reactive photoresist (not shown).

The photoresist layer on the blank is then exposed in an E-beam lithography system after which the photoresist is developed to form openings (not shown) therein. A heavy layer of gold, which serves as an absorber, is then electroplated into the openings formed in the photoresist by the developing step. The photoresist and any exposed chrome and gold plating base layers, not covered by the electroplated gold, is usually now stripped from the blank surface leaving the gold absorber deposits 16 and 17 on the silicon and polyimide surfaces as shown in FIG. 1.

This forms an X-ray mask which may now be used to expose a photoresist layer on a semiconductor wafer as will be later described. In the production of such masks extreme accuracy is required, for any errors or distortions appearing in the mask will result in the same errors or distortions being replicated in the final products which are created in the wafer. The present invention sets forth a method of creating such masks with an accuracy hitherto unknown and in which the common distortions discussed above have been either minimized or eliminated.

Figure 2:
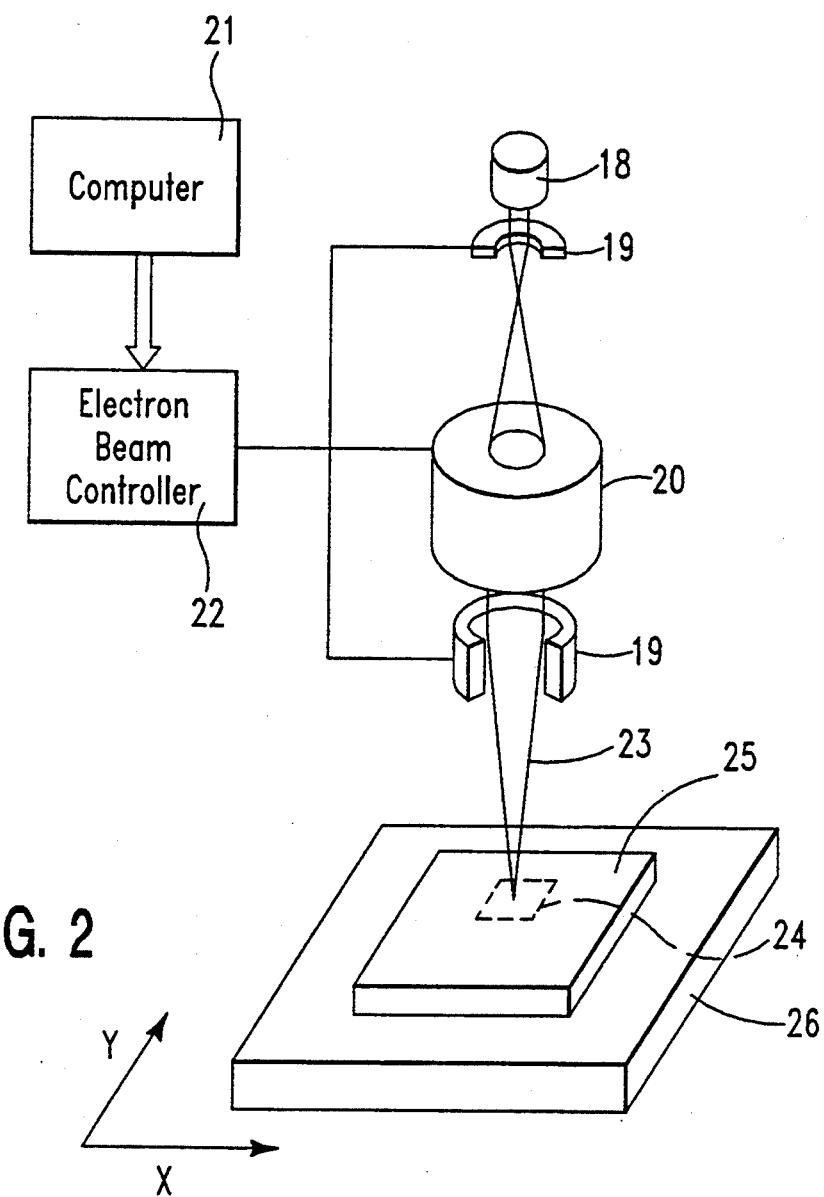
FIG. 2 schematically illustrates a computer controlled E-beam apparatus.

Suitable electron beam lithographic apparatus is well known, widely used and readily available in the semiconductor industry. In general this apparatus, schematically shown in FIG. 2, has an electron beam source 18 that generates a beam of electrons which can be deflected in the X and Y directions by a series of electromagnetic and electrostatic deflection plates and coils 19 and 20. These plates and coils can be readily controlled by a computer 21 through an electron beam controller 22. By controlling the plates and coils the beam 23 is caused to scan a limited region 24 on the workpiece 25 on which it is impinging. To bring new regions under the beam, the workpiece is generally mounted on a suitable stepping stage 26, movable in the X-Y directions.

Figure 4:
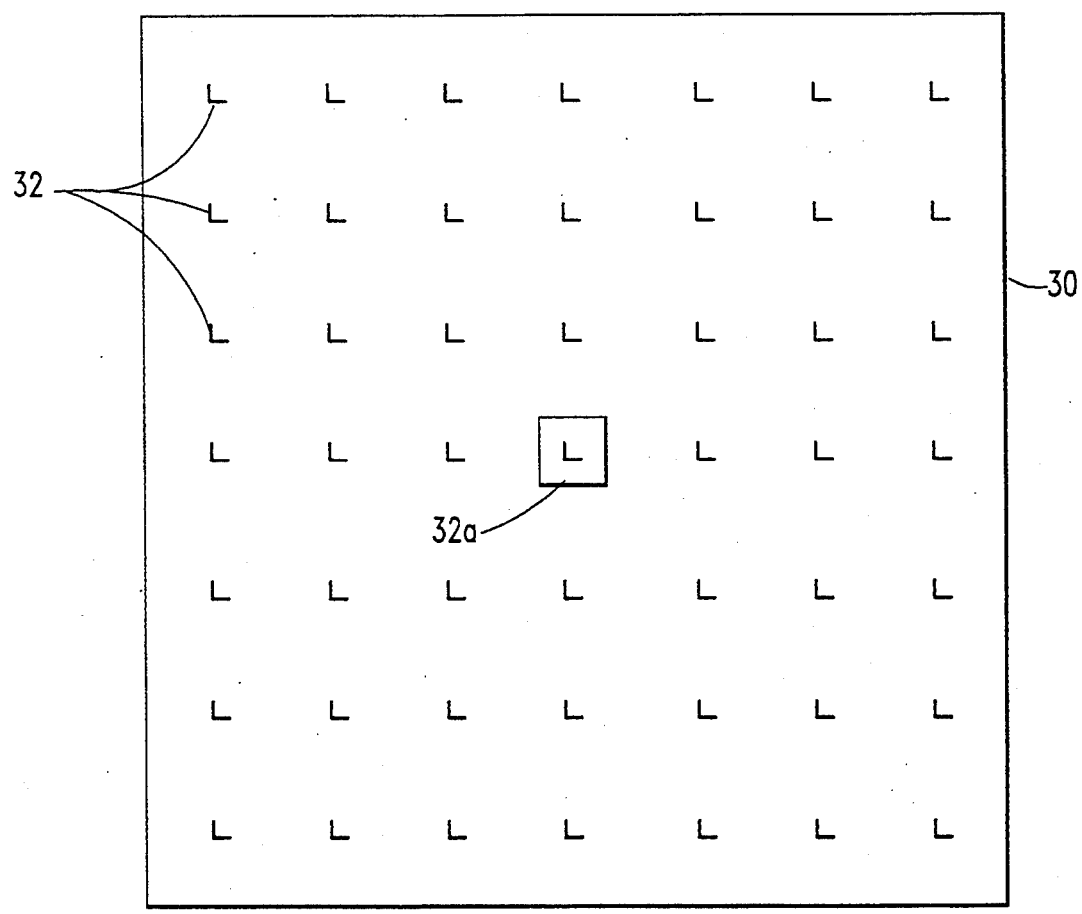
FIG. 4 illustrates in an enlarged form one of the fields of FIG. 3, with a plurality of alignment marks therein used for gross correction.
Figure 3:
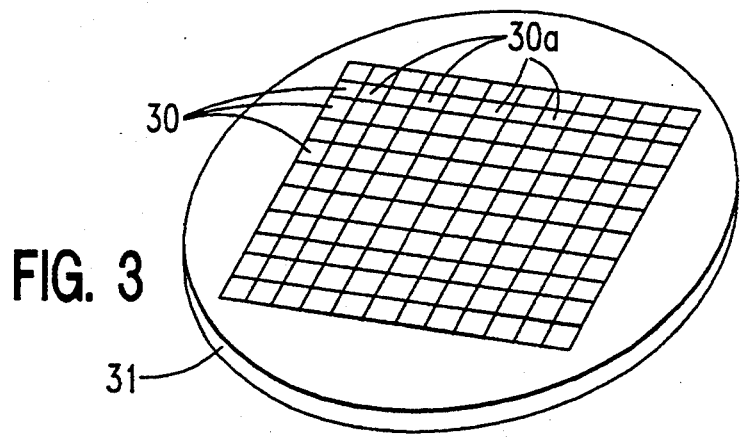
FIG. 3 illustrates a substrate covered with photoresist and divided into a plurality of fields.

The apparatus is first calibrated for its stage stepping characteristics and for overall field distortions. This is accomplished by creating a plurality of equally sized fields 30 on a photoresist coated sacrificial substrate or workpiece 31 as shown in FIG. 3. A selected pattern of L-shaped alignment marks 32 is then written across each field 30, as shown in FIG. 4 which is an enlarged view of one such field 30. Once all the alignment marks are written into the photoresist, the photoresist is developed and the actual position of the central L-shaped image 32a, in each field, is measured with respect to where it should be if it were in its ideal position. The ideal position is that position it would be in if no distortion had occurred. These measurements are made with a laser interferometer-based optical measuring tool designed for micro and macro-dimensional analysis of masks and reticles with a resolution, accuracy, and repeatability in the nanometer range. One suitable instrument for performing such measurements is sold by the Leica company under the designation LMS 2000.

Figure 5:
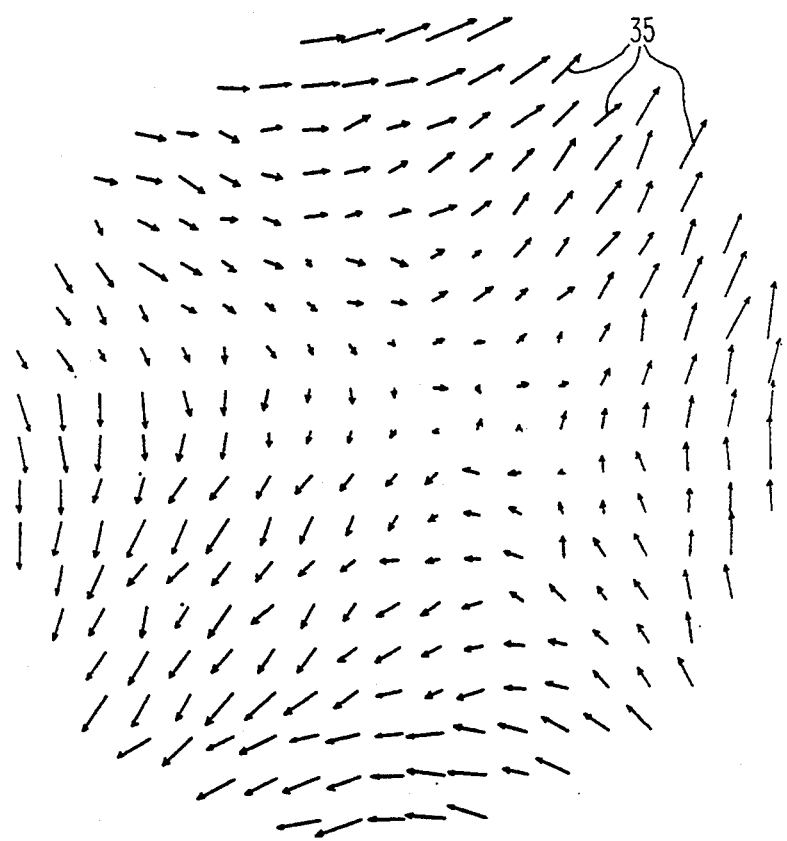
FIG. 5 is a top view of a substrate similar to the substrate of FIG. 3 in which the uncompensated table and translational errors in each field is illustrated by a respective vector.

The vectors 35, shown in FIG. 5, i.e., the distance and direction between the measured position and the ideal position of each of the measured alignment marks, are determined. Once so determined a straight translation correction factor is established for each vector and applied to that vector. This correction factor is a vector of equal and opposite value to that of the determined vector and is applied to return each respective, measured alignment mark to as close to its ideal position as is presently possible. In FIG. 5 each vector 35 represents the uncorrected translational error to be found in a respective field. On an actual example the three sigma factor, which is a measure of distributions of the measurements about the theoretical or ideal sites, was 102 nanometers in the X direction and 105 nanometers in the Y direction.

Figure 6:
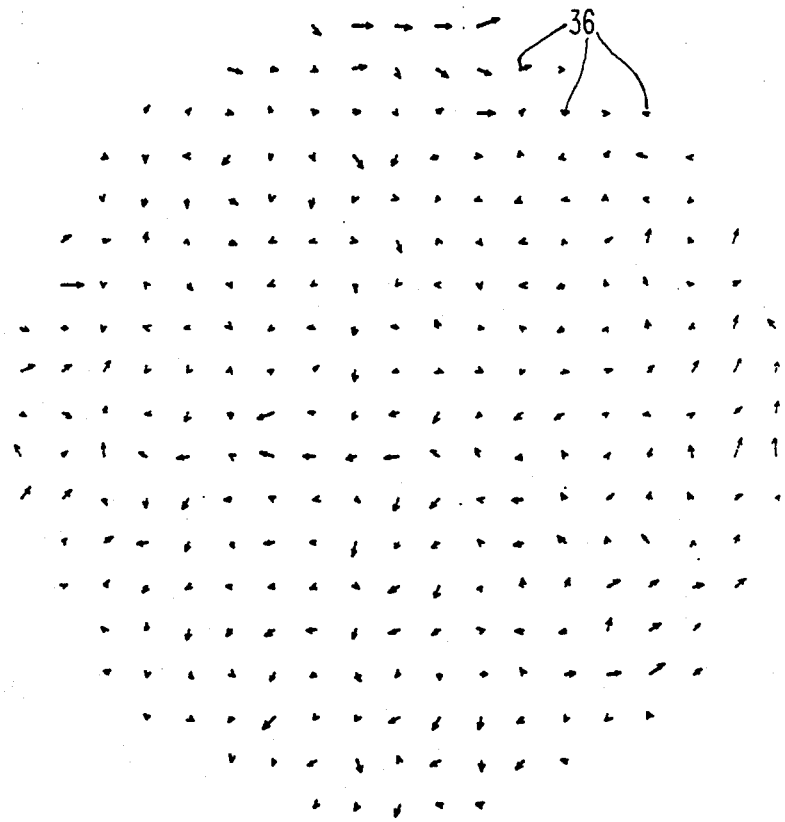
FIG. 6 is a top view of a substrate similar to the substrate of FIG. 5 in which the compensated table translational errors in each field is illustrated by a respective vector.

These established translation factors now are applied, as a correction factor, to all the fields to correct for these translational errors by storing the calculations in the computer 21 that controls the electron beam controller 22. The computer 21 causes the controller 22 to drive the beam 23 in a direction and for a distance to substantially eliminate this translational error for each field 30. The results of applying such correction factors to the apparatus is shown in FIG. 6. In this FIG. 6, each vector 36 now represents the compensated transitional factor. It can be seen from this FIG. 6 that these translational errors 36 have been significantly reduced and are significantly smaller than the uncorrected vectors 35, shown in FIG. 5, when compared on a field to field basis. In the actual example the three sigma factor was for the X direction reduced to 33 nanometers and for the Y direction reduced to 32 nanometers thus achieving a significant improvement. Any error that might be remaining is at present time may be further compensated for by using the established correction factors obtained to create a new sacrificial substrate and repeating the above process.

Each field 30 also contains distortions resulting from rotation, magnification and non-orthogonality or skew. To correct for these distortions a number of fields 30a, (FIG. 3) say twenty-five fields out of a total number of about one hundred fields on the entire substrate, are selected at various positions across the entire substrate.

Once these fields are selected, the actual position of each of the L-shaped marks 32, in each selected field, is measured with respect to where it should be if it were in its ideal position. The ideal position is defined as that position it would be in if no distortion had occurred. These measurements are made with the same laser interferometer-based optical measuring tool designed for micro and macro-dimensional analysis of masks and reticles with a resolution, accuracy, and repeatability in the nanometer range described above and sold by the Leica company under the designation LMS 2000.

The distances and directions, i.e., the vectors, between the measured positions and the ideal positions are calculated and then the distributions of such measured positions relative to the ideal positions are determined by using the well known least-squares-fit method. The result of such calculations for one such field 30a is shown in FIG. 7 as a plurality of individual vectors 40. Each vector 40 represents the uncorrected distortions affecting each measured mark in that field and are due to magnification, rotation and skew.

A correction factor is now determined by using the well known least-squares-fit method. This requires that a figure be established from all the measurements from a selected field 30a for that selected field. The figures so established for all the measured fields are now averaged, to arrive at a single correction factor which is now applied to all the vectors 40 in all the fields 30 to correct for the distortions due to magnification, rotation and skew. The actual uncompensated measurement resulted in a three sigma factor of 63 nanometers for the X direction and 48 nanometers for the Y direction. These distortions are corrected by storing in the computer 21 information that will cause the beam to move in a direction and in an amount as to compensate for the distortions represented by vectors 40 for each field 30. The results of applying such correction factors to the apparatus is shown in FIG. 8. Here each vector 41 represents the residual distortion due to rotation, magnification and skew remaining after the correction factor has been applied. It can be seen from this FIG. 8 that the errors due to these distortions have been significantly reduced. In the actual example the three sigma factor after correction was 36 nanometers for the X direction and 42 nanometers for the Y direction. If one wishes to measure each field on the substrate, rather than just fields 30a, a finer correction factor can be established and these distortions can be further reduced. It is also possible to achieve still finer correction factors by forming in a new sacrificial substrate new alignment marks by using the obtained corrected information and repeating the above measurements, determinations and calculations. This repetitive process is however lengthy and time consuming.

Having made the above corrections to compensate for the stage translational errors as well as the distortion due to rotation, magnification and skew, the uncompensated distortions now remaining are those related to factors affected by the process used to deposit the gold absorber deposits 16 and 17, such as stress induced errors, or those due to the interaction characteristics of the electrons in the beam and the photoresist, such as localized heating during exposure and charging of the resist itself or those that are pattern dependent, i.e., related to the shape and layout of the pattern being created in the photoresist.

Figure 9:
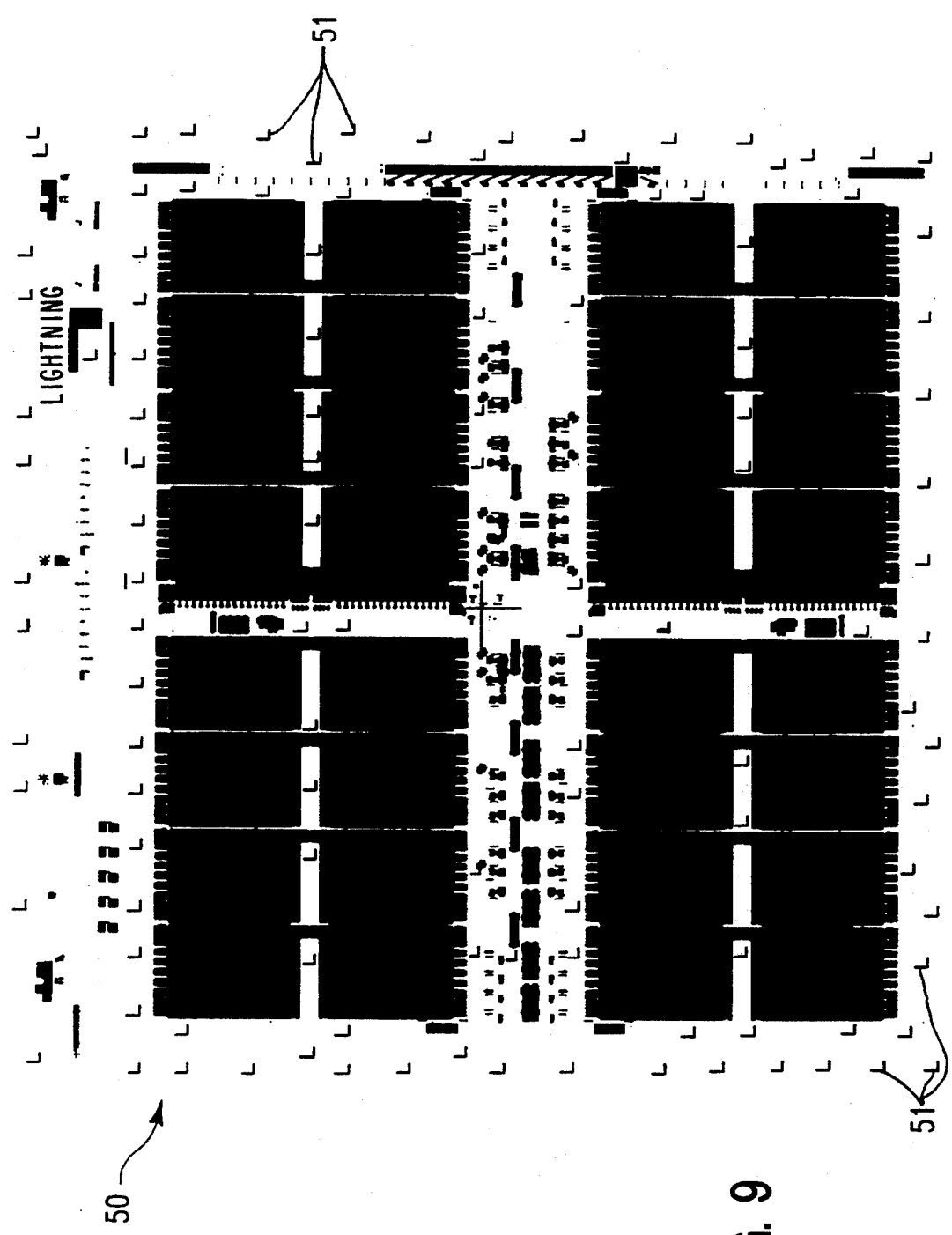
FIG. 9 is a top view of a prototype mask having a desired image and a plurality of alignment marks therein.

At the present time many semiconductor chips are so large that the masks required to produce them cover a number of fields. One such mask 50 incorporating a chip design covering thirty-six such fields is shown in FIG. 9. In this FIG. 9, a plurality of alignment marks 51 are incorporated therein as will be further described below.

Once the above-described correction or compensation information is provided to the E-beam apparatus, a prototype of the actual X-ray mask to be replicated is formed. This mask is formed by selecting a suitable silicon blank, exposing it to the desired image and following the well known mask making process steps described earlier. In forming this mask the E-beam apparatus being used is, of course, controlled to compensate for all the previously detected errors and distortions. This prototype mask is provided with a series of alignment marks 51 by creating the marks 51 in the image. Thus, the marks 51 are produced in the mask simultaneously with the image. These marks 51 are placed in the design in any convenient position or area where they will not interfere with the pattern and configuration of the desired image. Once the prototype has been exposed it is developed. Because the pattern-induced distortions can alter both the configuration and the position of the marks 51, both the configuration and position of the formed images are corrected by measuring the position of the marks in each field contained in the mask and comparing their actual position with their ideal position to determine the distance and direction between the actual position and the ideal position of each measured mark. This information is obtained by using the LMS 2000 optical measuring apparatus referred to above.

Figure 10:
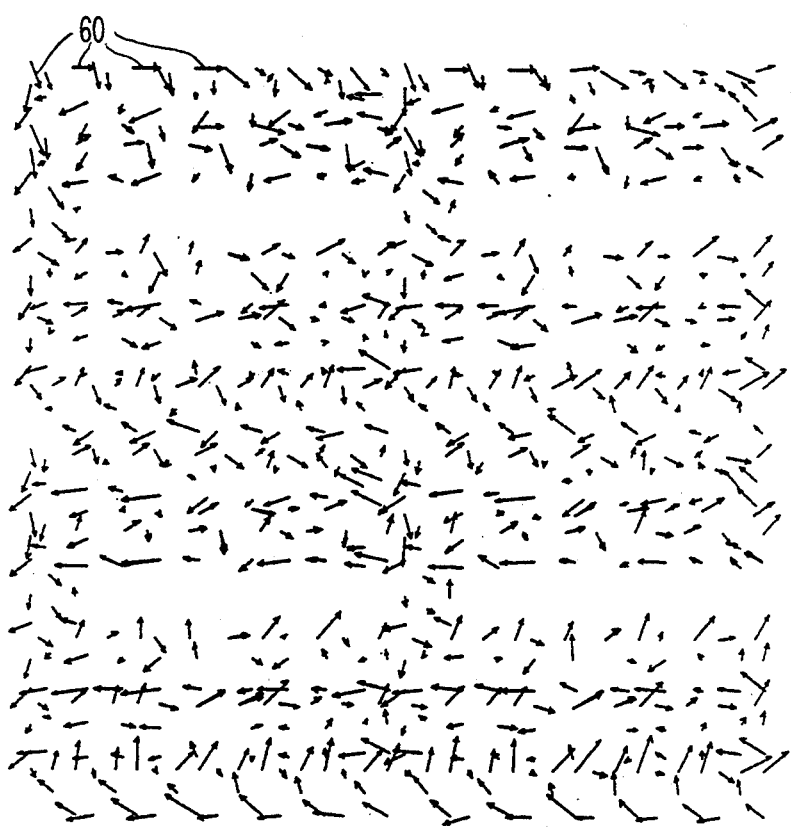
FIG. 10 is a top view of a substrate in which each alignment mark of the image of FIG. 9, uncompensated for process and pattern induced distortions, is illustrated by a respective vector.

The results of such measurements are shown in FIG. 10 as a plurality of individual vectors 60. Each vector 60 represents the uncorrected factors related to the process used to deposit the heavy gold layer used as an absorber, i.e., stress induced errors, or those due to the interaction characteristics of the electrons in the beam and the photoresist, such as localized heating during exposure and charging of the resist itself or those that are pattern dependent, i.e., related to the shape and layout of the pattern being created in the photoresist.

Again calculations are made by using the well known least-squares-fit method. These calculations are based on the measurements from all of the fields encompassing the chip design. It is preferred to make all the measurements at one time and to store this information on a field by field basis. Once the measurements are obtained from all the fields a correction factor for each field is established and applied to that respective field. Alternately a respective field could be measured and a correction factor determined for that field following which a different respective field is then measured and its correction factor determined. This measurement and correction factor determination sequence would be continued until each field in the prototype mask has been measured and its correction factor determined.

Figure 11:
FIG. 11 is a top view of a substrate in which each alignment mark of the image of FIG. 9, compensated for process and pattern induced distortions, is illustrated by a respective vector.

The correction factors thus determined correct the fields for the process-induced, the interaction, and the pattern-dependent distortions. These factors are stored in the computer 21 and used by the computer to cause the beam 23 to move in a direction and in an amount to compensate for these distortions. The results of applying such correction factors to the apparatus is shown in FIG. 11. Here each vector 61 indicates the result of corrections made for the process, the interaction characteristics, and the pattern distortions. It can be seen from this FIG. 11 that the errors due to these factors have been significantly reduced.

Once all such corrections, have been provided to the computer that controls the beam, a new mask using the corrected information is now made. It should be noted here that the alignment marks used in the prototype mask are not used or produced in this final mask. In this newly created mask, which is used to produce the final product, each element in the image is positioned closer to its ideal position.

In the prototype mask the three sigma factor was 87 nanometers in the X direction and 66 nanometers in the Y direction. The final mask produced, using all the compensated and corrected information, had a three sigma factor of 45 nanometers for the X direction and 45 nanometers for the Y direction. Thus, by employing the above-described method, a significant improvement in mask making has been realized and superior semiconductor chips have been produced.

It should be noted that other calculation methods other than the Least-squares-fit method may be used to make the above described determinations.

It should be further noted that although the preferred embodiment was directed towards the making of an X-ray mask that the invention can be employed with great success with the making of any mask, X-ray or optical, in which an E-beam apparatus is used. In fact, the method of the present invention may be used in connection with the E-beam writing of structures other than masks, e.g., semiconductor wafers.

It should be understood that although the invention has been described with respect to a preferred embodiment, that one skilled in the art can, from the foregoing, readily make changes in form and detail without departing from the spirit and scope of the invention.

What is claimed is:

1. A method of correcting for errors in an image formed in a mask comprising the steps of:

creating a prototype mask by using an electron beam apparatus, said mask containing a selected image to be replicated in a semiconductor body, which image contains a plurality of elements and a plurality of alignment marks;

measuring the position of each of said alignment marks in said image and comparing said measured position with a predetermined ideal position for each of said respective one of said marks in said image;

calculating the difference between the measured position of each of said marks in said image and its predetermined ideal position;

determining correction factors from said calculated differences;

providing said electron beam apparatus with said determined correction factors; and creating a final mask, free of said alignment marks, with said electron beam apparatus by applying each of said determined correction factors to said image to reposition the elements of the image closer to their ideal position.

2. The method of claim 1 wherein said mask is an X-ray mask comprised of a silicon blank having gold absorbers thereon.

3. The method of claim 1 wherein said apparatus is provided with a computer control and said correction factors are installed in said computer and said computer controls the position of the beam in said apparatus.

4. A method of correcting for errors in an image formed in a mask comprising the steps of:

coating a selected surface of a substrate with photoresist;

positioning an E-beam projection apparatus over said substrate surface for projecting an E-beam onto said surface, said E-beam apparatus including means for controlling the position of said beam on said surface;

dividing the substrate surface into a plurality of fields;

controlling said beam to place a first set of alignment marks in specified positions in each of said fields, at least one mark of said first set of marks being centrally located in said field;

establishing a predetermined ideal position for each mark in said first set of marks;

detecting the position of each said centrally located alignment marks with respect to said respective predetermined position for each of said respective centrally located marks in each of said respective fields;

calculating the difference between each said detected position of said centrally located marks and each said respective predetermined position;

providing said control means with said calculated differences to reposition said beam;

creating a prototype mask containing a selected image, which image includes a second set of alignment marks, by using said electron beam apparatus provided with said calculated differences;

establishing a predetermined ideal position for each mark in said second set of marks;

measuring the position of each mark in said second set of alignment marks in said image and comparing said measured position with said predetermined ideal position for each of said respective one of said marks in said second set of marks;

calculating the difference between the measured position of each of said marks in said second set of marks and its predetermined ideal position;

determining a correction factor from said calculated difference for each alignment mark to reposition each said alignment mark closer to its ideal position;

providing said electron beam apparatus with each determined correction factor; and creating a final mask, containing said selected image without said alignment marks therein, with the electron beam apparatus provided with each said determined correction factor.

5. The method of claim 4 wherein said mask is an X-ray mask comprised of a silicon blank having gold absorbers thereon.

6. A method of forming a mask comprising the steps of:

writing, with an E-beam apparatus, selected patterns of alignment marks onto the surface of a photoresist coated sacrificial substrate;

developing the photoresist on said sacrificial substrate;

measuring the actual position of the formed marks, comparing the measured actual position of the marks to a predetermined position the marks should be in if no errors or distortions were present;

selectively modifying the E-beam apparatus to alter its magnetic and electrostatic forces for controlling the beam and adjust the position of the marks to match the predetermined position as closely as possible;

forming a prototype of a mask to be replicated with said modified E-beam apparatus comprising the steps of:

selecting a photoresist coated mask blank;

forming the image to be replicated in said mask in said photoresist, said image including a series of alignment marks mask placed in said image in an area where they will not interfere with the pattern and configuration of the image;

developing the photoresist and creating the prototype mask;

measuring the actual position of the marks on said prototype mask and comparing their actual position with their ideal position;

calculating a correction factor necessary to reposition said the marks on said prototype mask closer to their ideal position;

providing said correction factor to the computer controlling the E-beam apparatus; and creating a final working mask from said corrected information said final mask containing said selected image without said alignment marks therein.

7. The method of claim 6 wherein said mask is an X-ray mask comprised of a silicon blank having gold absorbers thereon.

8. The method of claim 6 wherein there is further provided the step steps of;

dividing the sacrificial substrate into a plurality of fields.

9. A method of forming a mask comprising the steps of:

writing with an E-beam apparatus, selected patterns of alignment marks onto the surface of a photoresist coated sacrificial substrate;

developing the photoresist on said sacrificial substrate;

dividing the sacrificial substrate into a plurality of fields;

measuring the actual position of all the marks in each respective field, with respect to the predetermined position;

averaging all said measurements in each said respective field; and determining a correction factor from each said average to adjust the actual position of all said marks in each respective field selectively modifying the E-beam apparatus to alter its magnetic and electrostatic forces for controlling the beam and adjust the position of the marks to match the predetermined position as closely as possible;

forming a prototype of a mask to be replicated with said modified E-beam apparatus comprising the steps of:

selecting a photoresist coated mask blank;

forming the image to be replicated in said mask in said photoresist, said image including a series of alignment marks mask placed in said image in an area where they will not interfere with the pattern and configuration of the image;

developing the photoresist and creating the prototype mask;

measuring the actual position of the marks on said prototype mask and comparing their actual position with their ideal position;

calculating a correction factor necessary to reposition said the marks on said prototype mask closer to their ideal position;

providing said correction factor to the computer controlling the E-beam apparatus; and creating a final working mask from said corrected information said final mask containing said selected image without said alignment marks therein.

10. The method of claim 9 wherein all said averages are combined to provide a single correction factor for all of said fields.

* * * * *